United States Patent
Ooishi (10) Patent No.: US 6,901,025 B2
(45) Date of Patent: May 31, 2005

(54) NONVOLATILE SEMICONDUCTOR MEMORY DEVICE WHICH CAN BE PROGRAMMED AT HIGH TRANSFER SPEED

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/461,683

(22) Filed: Jun. 16, 2003

(65) Prior Publication Data

US 2004/0120212 A1 Jun. 24, 2004

(30) Foreign Application Priority Data

Dec. 18, 2002 (JP) ........................................ 2002-366744

(51) Int. Cl.⁷ ................................................. G11C 7/00
(52) U.S. Cl. .................... 365/233; 365/189.03; 365/210
(58) Field of Search ........................... 365/233, 189.03, 365/210

(56) References Cited

U.S. PATENT DOCUMENTS 6,347,056 B1   2/2002  Ledford et al.
6,392,957 B1 * 5/2002  Shubat et al. ............... 365/233
6,643,204 B1 * 11/2003 Agrawal ...................... 365/210

FOREIGN PATENT DOCUMENTS

JP          5-342118        12/1993

* cited by examiner

*Primary Examiner*—Richard Elms
*Assistant Examiner*—Pho M. Luu
(74) *Attorney, Agent, or Firm*—McDermott Will & Emery LLP (57) ABSTRACT

In a read operation, for example, 32 sense amplifiers read 32 pieces of data in a group. After that, the read data is outputted on a 4-bit unit basis. A memory cell array operates at a low frequency which is ⅛ of an actual data output frequency. On the other hand, in a write operation, data is transferred from the outside to a semiconductor memory device bit by bit every cycle. Consequently, by providing a number of latches of a pipeline in a write access path, the writing operation is enabled even at a high frequency. Specifically, at the time of reading, a memory array operates at a low frequency which is ⅛ of a data output frequency. At the time of writing, data is written every clock.

5 Claims, 10 Drawing Sheets

NONVOLATILE SEMICONDUCTOR MEMORY DEVICE WHICH CAN BE PROGRAMMED AT HIGH TRANSFER SPEED

BACKGROUND OF THE INVENTION

1. Field of the Invention

The present invention relates to a data transfer interface mounted on a system LSI, and more particularly to a semiconductor memory device having an ultrahigh-speed data transfer interface between LSIs.

2. Description of the Background Art

For example, Japanese Patent Laying-Open No. 5-342118 discloses a conventional technique of increasing information transfer efficiency.

According to a data communication method of the conventional technique, information of different attributes is transmitted/received by a synchronous communication system or an asynchronous communication system. By selecting a communication system at the time of transmission in accordance with the attributes of information transmitted/received, information is transmitted/received according to a method adapted to the attributes of the information. By performing transmission and reception of information via independent paths, information transfer efficiency is increased.

Conventionally, in the case of performing data transfer used for a system LSI, when one path for transmitting data signals includes a plurality of signal lines, the phases of signals have to be aligned in the plurality of signal lines. Consequently, phases which can be adjusted are constrained due to variations in impedances of the signal lines and the upper limit of the operation frequency is determined accordingly. In the case of using a nonvolatile memory as a memory connected to a high-speed data transfer interface, in a control system using an EEPROM and a flash memory, it takes time to program the memories. In this case, at the time of reading information while being downloaded from a server via a network, a dedicated buffer memory is necessary and transfer speed in a network is considerably regulated.

SUMMARY OF THE INVENTION

An object of the present invention is to provide a nonvolatile semiconductor memory device in which a wide operation margin can be assured even in high-speed data transfer between LSIs and which can be programmed at high transfer speed.

In summary, the present invention is directed to a semiconductor memory device, when M is a positive number and N is a positive number smaller than M, including: a memory cell group in which write cycle time is shorter than read cycle time; a read circuit for repeatedly and continuously reading output data from the memory cell group in a first cycle indicated by a period which is M times as long as one cycle of a clock signal; and a write circuit for repeatedly and continuously writing input data to the memory cell group in a second cycle indicated by a period which is N times as long as one cycle of the clock signal.

According to another aspect of the present invention, a semiconductor memory device for continuously reading/writing data synchronously with clock signals includes a memory cell group in which write time is shorter than read time. The memory cell group includes a plurality of memory cells arranged in a matrix. The semiconductor memory device further includes: a read circuit for selecting a first predetermined number of columns in accordance with an address signal and reading output data from the first predetermined number of columns in a group; and a write circuit for selecting a second predetermined number of columns which is smaller in number than the first predetermined number in accordance with the address signal in a cycle shorter than a column selection cycle of the read circuit and writing input data to the second predetermined numbers of columns.

A main advantage of the present invention is in that since data is read/written in a cycle time individually optimized to read/write characteristics of a memory cell, high-speed access can be realized in both reading and writing of data from/to a memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings. The same reference numeral in the figures denotes the same or corresponding parts.

Figure 1:
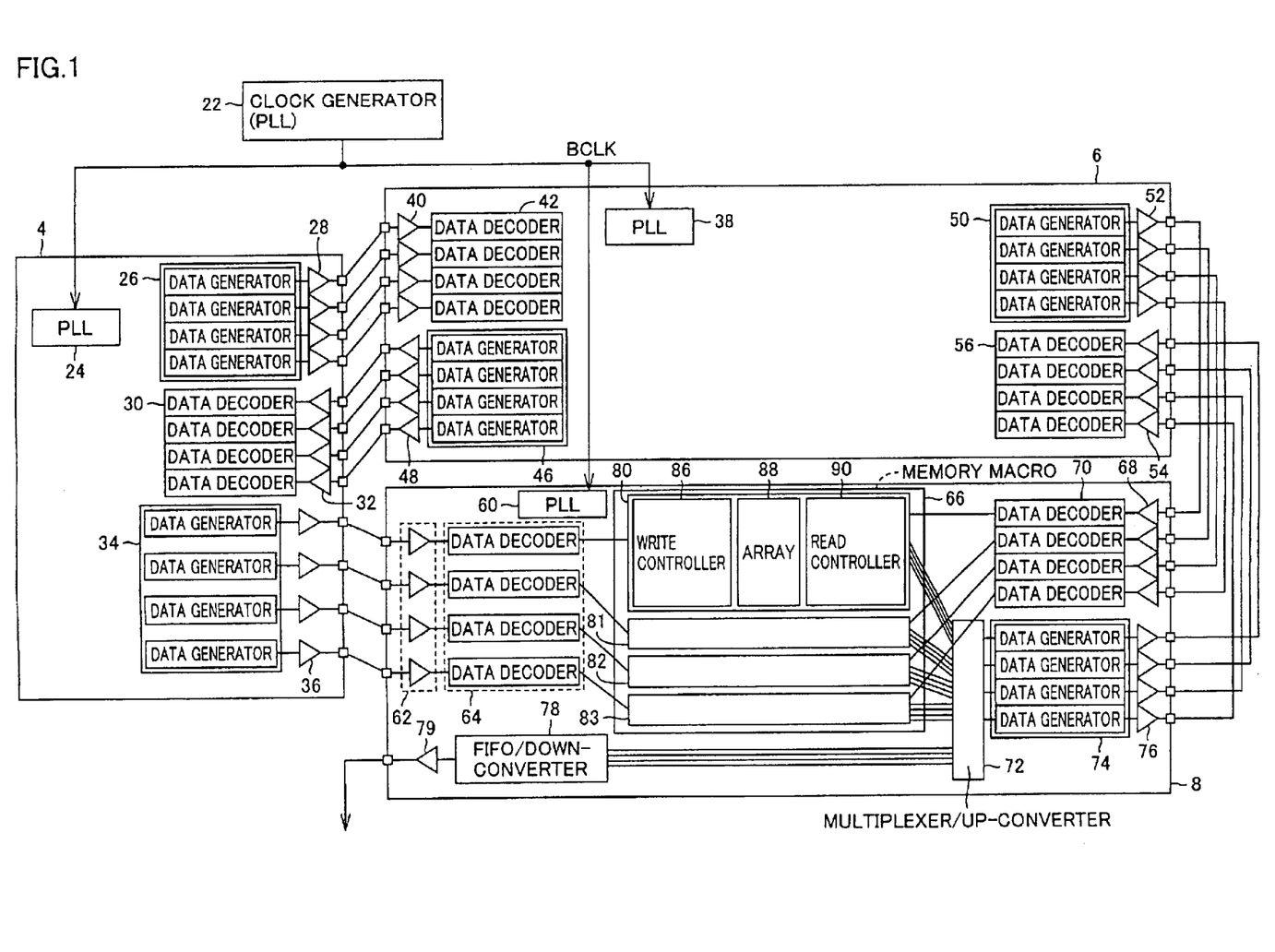
FIG. 1 is a diagram showing a schematic configuration of a semiconductor memory device 8 used for the present invention, and an coupling exchange 4 and a signal processor 6 connected to semiconductor memory device 8.

FIG. 1 is a diagram showing a schematic configuration of a semiconductor memory device 8 used for the present invention and a coupling exchange 4 and a signal processor 6 connected to semiconductor memory device 8.

Referring to FIG. 1, semiconductor memory device 8 includes: a PLL (Phase Locked Loop) 60 for receiving a basic clock signal BCLK from a clock generator 22; an input buffer 62 for receiving data transferred from coupling exchange 4; a data decoder 64 for decoding data supplied from input buffer 62; an input buffer 68 for receiving data transferred from signal processor 6; a data decoder 70 for receiving data from input buffer 68 and decoding the data; and a memory macro 66 for storing the data decoded by data decoders 64 and 70.

Semiconductor memory device 8 further includes: a multiplexer/up-converter 72 for receiving data read from memory macro 66; a data generator 74 for receiving an output of multiplexer/up-converter 72; an output buffer 76 for outputting an output of data generator 74 to signal processor 6; an FIFO/down-converter 78 for receiving an output of multiplexer/up-converter 72; and an output buffer 79 for receiving an output of FIFO/down-converter 78 and outputting the data to the outside of semiconductor memory device 8.

Each of input buffers 62 and 68 includes input buffers of four systems. Each of data decoders 64 and 70 includes data decoders of four systems. Memory macro 66 includes four memory banks 80 to 83 in correspondence with the data decoders of four systems. Memory bank 80 includes: an array 88 in which memory cells are arranged in a matrix; a read controller 90 for performing a read control for reading data from array 88; and a write controller 86 for performing a write control for writing data to array 88. Each of memory banks 81 to 83 has a configuration similar to that of memory bank 80 and its description will not be repeated.

Coupling exchange 4 includes: a PLL 24 for receiving basic clock BCLK from clock generator 22; a data generator 26 and an output buffer 28 for outputting data to signal processor 6; and an input buffer 32 and a data decoder 30 including input buffers of four systems and data decoders of four systems, respectively, for receiving data transferred from signal processor 6.

Coupling exchange 4 further includes a data generator 34 and an output buffer 36 including data generators of four systems and output buffers of four systems, respectively, for outputting data to semiconductor memory device 8.

Signal processor 6 includes: a PLL 38 for receiving basic clock signal BCLK from clock generator 22; an input buffer 40 for receiving data transferred from coupling exchange 4; a data decoder 42 for receiving data from input buffer 40 and decoding the data; a data generator 46 for generating data to be transferred to coupling exchange 4; an output buffer 48 for receiving an output of data generator 46 and outputting the data to coupling exchange 4 via an external bus; a data generator 50 and an output buffer 52 for outputting data to semiconductor memory device 8; and an input buffer 54 and a data decoder 56 for receiving data from semiconductor memory device 8.

In each of signal processor 6, semiconductor memory device 8 and coupling exchange 4, the data generator is disposed on the data output side, and the data decoder is disposed on the data input side. The data generator adjusts the phase of data latched as output data with respect to a clock and outputs the resultant data. The data decoder receives input data synchronously with an internal clock so as to be used internally and latches the data.

Between coupling exchange 4 and semiconductor memory device 8 for storing signals, unidirectional data transfer from coupling exchange 4 to semiconductor memory device 8 is performed. On the other hand, between coupling exchange 4 and signal processor 6, bidirectional data transfer is performed. Similarly, between signal processor 6 and semiconductor memory device 8, bidirectional data transfer is performed. A data generator and a data decoder are connected to each other via a single signal line. Between each data generator and each data decoder, phase adjustment for synchronization is individually carried out.

To the system of FIG. 1, basic clock BCLK as a unified clock is supplied from clock generator 22. Clock generator 22 generates clock BCLK of frequency lower than that of the 3 GHz clock from a low reference clock by, for example, a PLL or the like. Generated basic clock BCLK is supplied to the three chips in each of which the phase of supplied clock is adjusted again by the PLL and a clock signal of 3 GHz is generated internally.

Desirably, the impedances of the lines from clock generator 22 to the chips are matched as much as possible. However, it is impossible to perfectly match the impedances in reality, the phases of clock signals of 3 GHz in the chips are slightly deviated from each other. A slight difference exists also in the impedances of the four signal lines included in one path. Therefore, a phase difference occurs in signals transmitted via the signal lines.

In the present invention, phase differences of signals transmitted to the four signal lines are not adjusted. The phase difference is adjusted between transmission and reception of the data generator and the data decoder in one-to-one manner. The adjustment is performed so that a signal receiving margin on the data decoder side becomes maximum.

Specifically, the internal clock of 3 GHz generated by the PLL in each chip is a common clock in the chip. The clock signal is supplied mainly to the data generator in the chip. The data generator generates continuous data which is outputted synchronously with the clock.

However, in the data decoder for receiving data from the other party, the internal clock generated by the PLL is not used as it is for the reason that the phases of data inputted to the four data decoders are different from each other due to slight differences in the impedances of the signal lines. Since the speed frequency of the clock signal is very high, there is the possibility that the phase difference of data in the four signal lines is one cycle of a 3 GHz clock or more.

Figure 2:
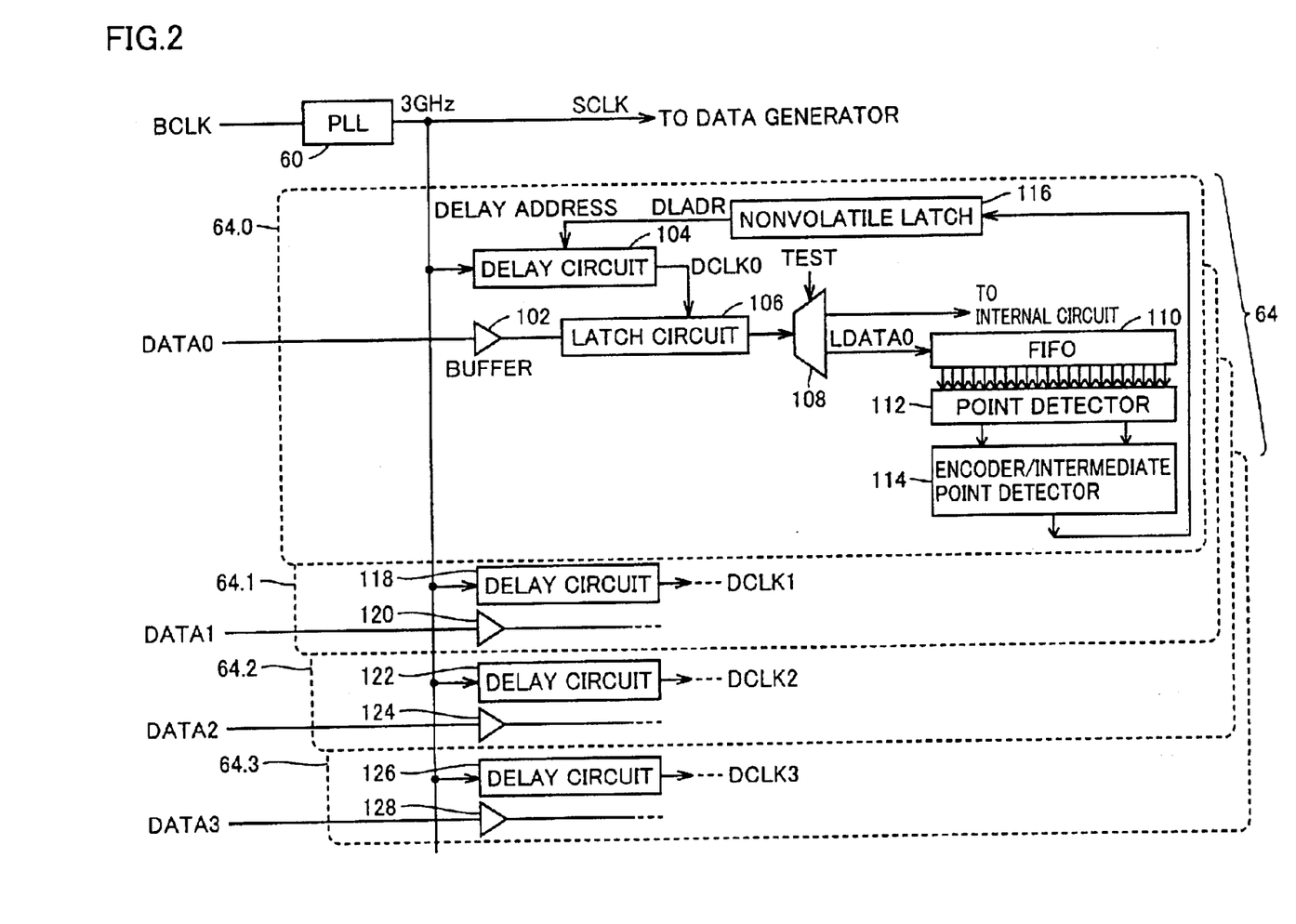
FIG. 2 is a circuit diagram showing the configuration of a data decoder 64 in FIG. 1.

FIG. 2 is a circuit diagram showing the configuration of data decoder 64 in FIG. 1.

Since the configuration of the other data decoders in FIG. 1 is similar to that of data decoder 64, its description will not be repeated.

Referring to FIG. 2, data decoder 64 includes data decoders 64.0 to 64.3 for receiving signals DATA0 to DATA3, respectively, transmitted via four signal lines. Data decoder 64.0 latches data synchronously with an internal clock SCLK of 3 GHz generated by PLL 60 which receives basic clock BCLK. Data decoder 64.0 includes: a buffer 102 for receiving signal DATA0; a delay circuit 104 for delaying internal clock signal SCLK and outputting a delay clock DCLK0; a latch circuit 106 for receiving an output of buffer 102 synchronously with delay clock DCLK0; and a switching circuit 108 for switching an output of latch circuit 106 in accordance with a test signal TEST and outputting the resultant. In a normal operation, switching circuit 108 supplies an output of latch circuit 106 to an internal circuit. On the other hand, in a test mode, switching circuit 108 outputs an output of latch circuit 106 as signal LDATA0.

Data decoder 64.0 further includes a first-in first-out (FIFO) memory 110 for receiving signal LDATA0 and sequentially shifting the result; a point detector 112 for detecting a change point of data accumulated in FIFO memory 110; an encoder/intermediate point detector 114 for receiving an output of point detector 112; and a nonvolatile latch 116 for holding an output of encoder/intermediate point detector 114 in a nonvolatile manner.

Nonvolatile latch 116 outputs a delay address DLADR. Delay circuit 104 delays internal clock SCLK by a delay amount according to delay address DLADR and outputs delay clock DCLK0.

Data decoder 64.1 includes: a buffer 120 for receiving signal DATA1; and a delay circuit 118 for delaying internal clock signal SCLK and outputting a delay clock DCLK1. Data decoder 64.2 includes: a buffer 124 for receiving signal DATA2; and a delay circuit 122 for delaying internal clock signal SCLK and outputting a delay clock DCLK2. Data decoder 64.3 includes: a buffer 128 for receiving signal DATA3; and a delay circuit 126 for delaying internal clock signal SCLK and outputting a delay clock DCLK3.

Since the configuration of the other portion of data decoders 64.1 to 64.3 is similar to that of data decoder 64.0, its description will not be repeated.

The operation of the data decoder in FIG. 2 will now be described. First, the phase of basic clock BCLK of 3 GHz is adjusted so that input data is easily received by data decoder 64.0. In the case where input data is outputted synchronously with a clock signal, theoretically, if data is received synchronously with an internal clock signal of which phase is shifted by 180°, a margin for input data becomes the largest.

However, as described above, the phases of data signals transmitted vary among the signal lines due to variations in impedances of the signal lines. Consequently, an internal clock of which phase is shifted from that of basic clock BCLK by 180° is not always the best. Therefore, based on basic clock BCLK, internal clock SCLK is generated by PLL 60. Internal clock SCLK is split to data decoders 64.0 to 64.3. The phase of the split clock is adjusted with the phase of each input data, and a delay clock is generated. Consequently, in the four data decoders, delay circuits 104, 118, 122 and 126 for phase adjustment are disposed. The delay amount of each of delay circuits 104, 118, 122 and 126 can be independently determined.

In the semiconductor memory device of the present invention, when the system is activated at turn-on, for example, data generator 34 in FIG. 1 receives dummy data for phase adjustment from data generator 50. Meanwhile, a delay amount in delay circuit 104 is adjusted so that a data receiving margin becomes the maximum and the phase adjustment is performed. The operation of the phase adjustment will be described. Delay circuit 104 can change the delay amount little by little when delay address DLADR changes. Latch 106 receives the dummy data sent synchronously with the delayed clock. The result of the high or low level received by latch 106 is sent to FIFO memory 110 in the test mode.

Data decoder 64.0 which has received dummy data repeats sequentially transferring the reception result of the dummy data received by latch 106 synchronously with the delay clock outputted from delay circuit 104 to the FIFO while gradually increasing the delay amount of delay circuit 104 for phase adjustment. The exclusive OR of two successive results of received data transferred to the FIFO is computed, thereby detecting a change point between the high and low levels, that is, the point when the received data is inverted. The detection is performed by point detector 112.

Point detector 112 detects points where received data is inverted twice and, after that, an intermediate point between a delay amount of the first point and a delay amount of the second point is detected by encoder/intermediate point detector 114 and regarded as the maximum margin point. The point is fixed as a data reception phase in data decoder 64.0. A delay address corresponding to a delay setting amount extracted as the maximum margin point is stored in nonvolatile latch 116.

As described above, four kinds of delay clocks DCLK0 to DCLK3 for reception are generated. Specifically, each reception clock is supplied to each of the banks in the memory. Each bank handles one piece of independent data. The control circuit at the time of access to the memory array also operates independent of the banks. Since the independent control circuit operates in each bank, there is a case that operating clock cycles for the banks are different from each other in accordance with the impedances of the signal lines. However, independent phase adjustment is performed, so that there is no possibility that erroneous operation occurs in writing to the memory array.

According to the present invention as described above, the plurality of banks in the semiconductor memory device have independent control circuits and operate independently of each other irrespective of the clock cycles. Consequently, the phase adjustment of a receiving clock can be independently performed in the case where impedances of signal lines are different from each other. As a result, even in the case of a high frequency operation such that the clock frequency is higher than variations in the phase adjustment, the maximum state of the receiving margin with respect to data transfer can be assured in each signal line and the margin at the time of the high-frequency operation can be widened.

Figure 3:
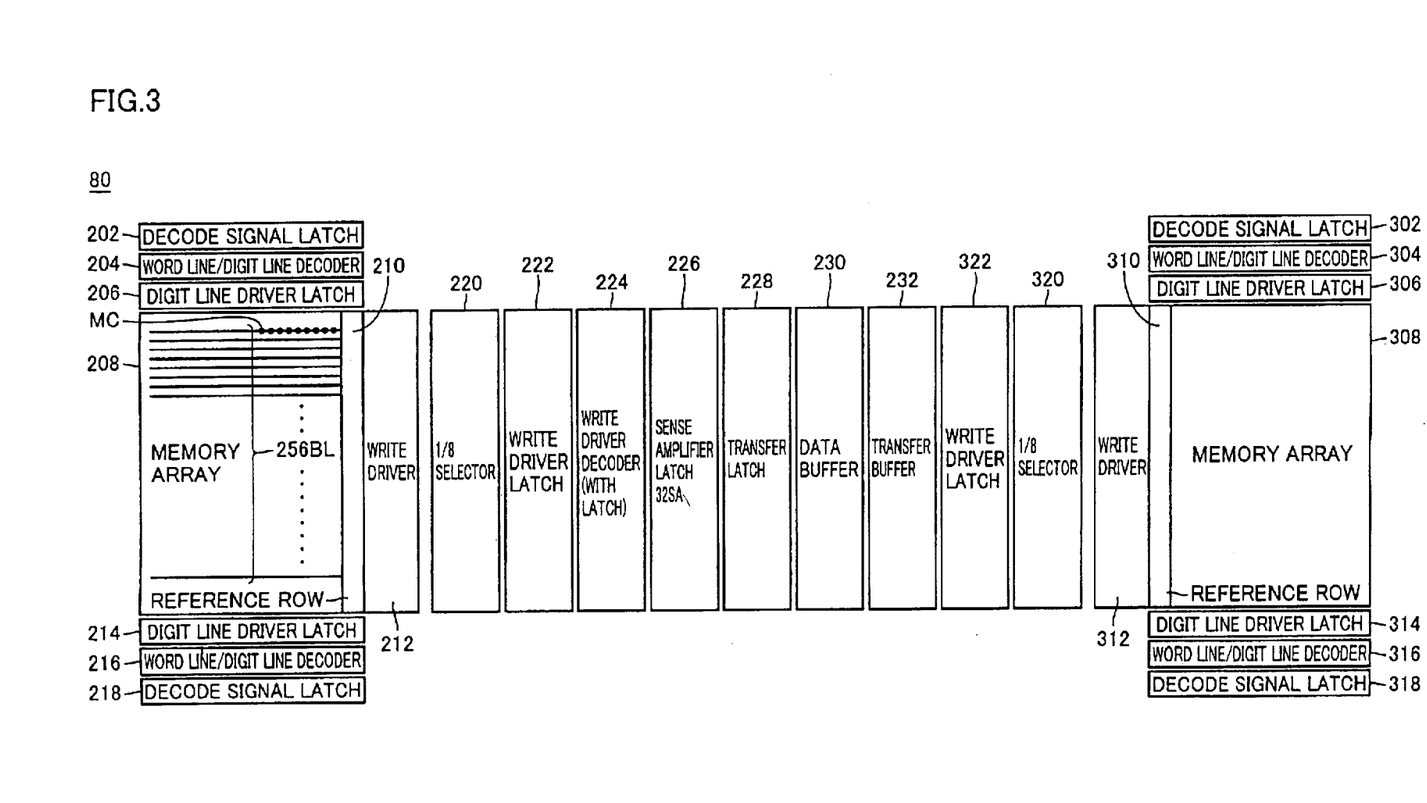
FIG. 3 is a diagram for describing one of banks in semiconductor memory device 8.

FIG. 3 is a diagram for describing each of the banks in semiconductor memory device 8.

Referring to FIG. 3, memory bank 80 includes memory arrays 208 and 308 in each of which 256 bit lines are disposed and memory cells MC are arranged in a matrix. Memory arrays 208 and 308 include reference rows 210 and 310, respectively, in which reference memory cells are disposed.

Memory bank 80 further includes, as row circuits, decode signal latches 202, 302, 218 and 318, word line/digit line decoders 204, 304, 216 and 316, and digit line driver latches 206, 306, 214 and 314 for controlling word lines and digit lines.

Memory bank 80 further includes write drivers 212 and 312, selectors 220 and 320 each for selecting one signal line out of eight signal lines, write driver latches 222 and 322, a write driver decoder 224, a sense amplifier latch 226 including 32 sense amplifiers, a transfer latch 228, a data buffer 230, and a transfer buffer 232.

As for a read system, 32 sense amplifiers are disposed for 256 bit lines. Data amplified by a sense amplifier is transferred to transfer latch 228 and outputted from transfer buffer 232. In practice, selection is further performed at the time of output from the memory array shown in FIG. 3 by the transfer buffer, so that total number of read data pieces outputted from a bank becomes four.

As for a write system, write data transferred via data buffer 230 is decoded by write driver decoder 224 and latched by write driver latches 222 and 322, thereby controlling write drivers 212 and 312. In the case of an MRAM (Magnetic Random Access Memory), unlike a DRAM (Dynamic Random Access Memory), a data signal is not written as it is into a memory cell. In the MRAM, a write driver is controlled by the polarity of data, the direction of a current flowing in a bit line is changed, and a magnetic substance in a memory cell is magnetized according to data.

Consequently, on/off control is performed on write drivers 212 and 312 in accordance with data.

In FIG. 3, reference memory cells are disposed in each of the two memory arrays. When one of the memory arrays is read-accessed, a reference memory cell disposed in the other memory array is selected. A memory cell current in the reference memory cell is transferred as a reference current to sense amplifier latch 226. A current amount of the access memory cell and that of a reference memory cell are compared with each other by the sense amplifier and data stored in the access memory cell is decoded.

Figure 4:
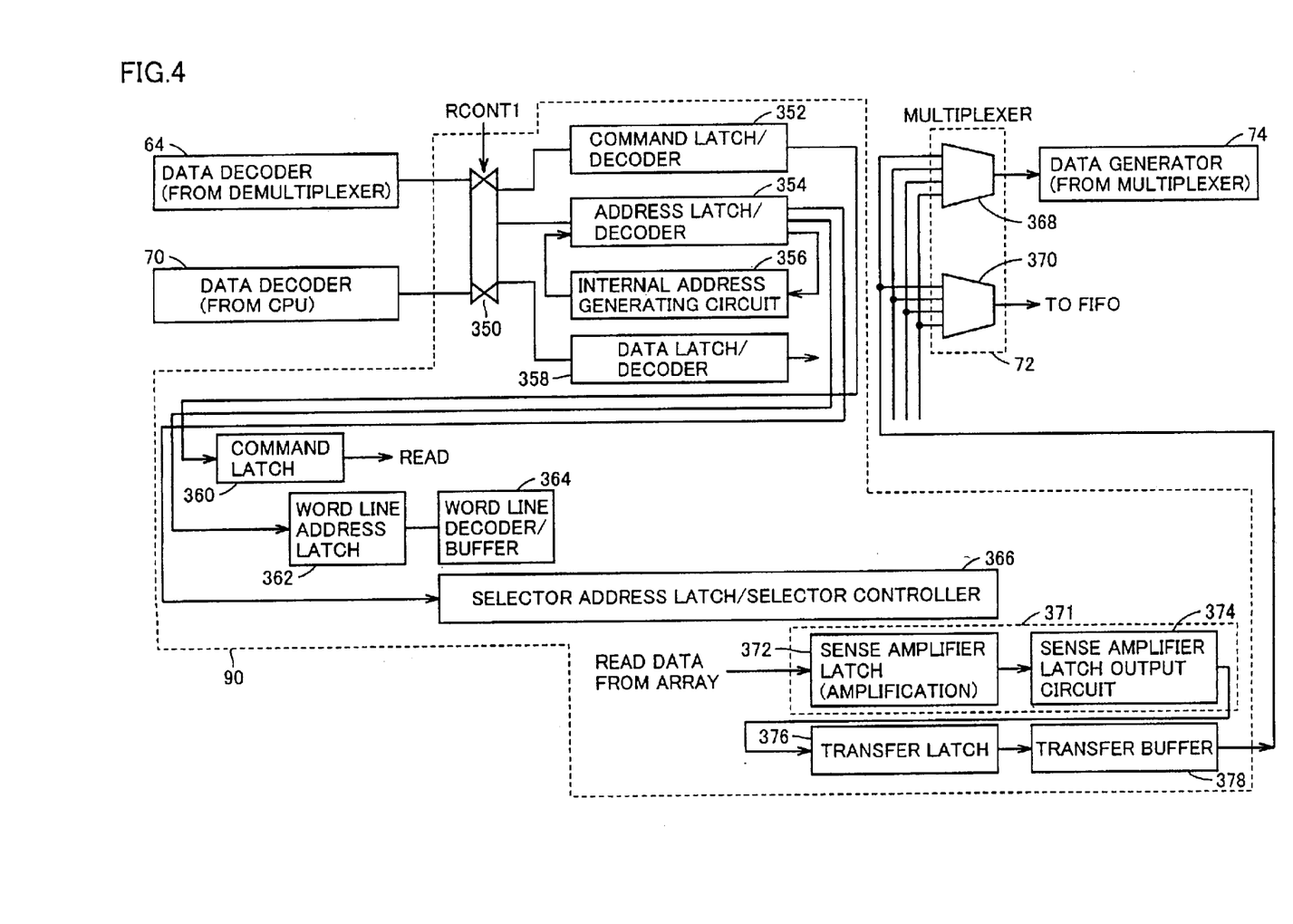
FIG. 4 is a diagram for describing a read controller 90 in the bank.

FIG. 4 is a diagram for describing read controller 90 in a bank.

Referring to FIG. 4, data is transmitted from coupling exchange 4 in FIG. 1 to data decoder 64 via a demultiplexer disposed in the output portion of coupling exchange 4. Data is sent from signal processor 6 to data decoder 70. Those data pieces are received every signal line synchronously with a clock of which delay amount is adjusted. As data, a command, an address, write data are transmitted via the same line. A path selector 350 selects a path for data of either data decoder 64 or 70 in accordance with a path control signal RCONT1. A data sequence transmitted is decoded by a command latch/decoder 352, an address latch/decoder 354, and a data latch/decoder 358.

With respect to addresses, the head address is latched by address latch/decoder 354. A serial address following the head address is generated by an incrementing process based on the head address by an internal address generating circuit 356. The address is transferred to a word line address latch 362, used by a word line decoder/buffer 364, and used for an array reading operation. Since write data is not inputted in the reading operation, an output of data latch/decoder 358 is ignored.

A command detected by command latch/decoder 352 is latched by a command latch 360 until the command is finished. An inputted address is decoded by address latch/decoder 354, recognized as a word line address and latched by word line address latch 362. The latched address is used for decoding a word line in word line decoder/buffer 364 and a word line is activated on the basis of a result of decoding. A part of the address simultaneously inputted is latched as a selection address for connecting a bit line and a sense amplifier in a selector address latch/selector controller 366 and used for a selector control.

In association with activation of a word line, a memory cell is selected and a current flowing in the memory cell is read by a sense amplifier circuit 371. The current is amplified by a sense amplifier latch 372, decoded by a sense amplifier latch output circuit 374, and the decoded data is transmitted to a transfer latch 376. After that, a piece of data is selected per bank by a multiplexer in a transfer buffer 378 and transferred to a data generator which is not shown.

Activation of a word line is performed in a cycle consisting of a plurality of clock cycles. Consequently, a stable reading operation can be performed. Further, in a reading operation, a plurality of pieces of data are simultaneously read in parallel from a memory array, thereby preventing read throughput from deteriorating. In the case of outputting data to a peripheral device of a lower operation frequency, read data is serially transferred to FIFO/down-converter 78 shown in FIG. 1, and data is outputted from output buffer 79 to the peripheral device.

Figure 5:
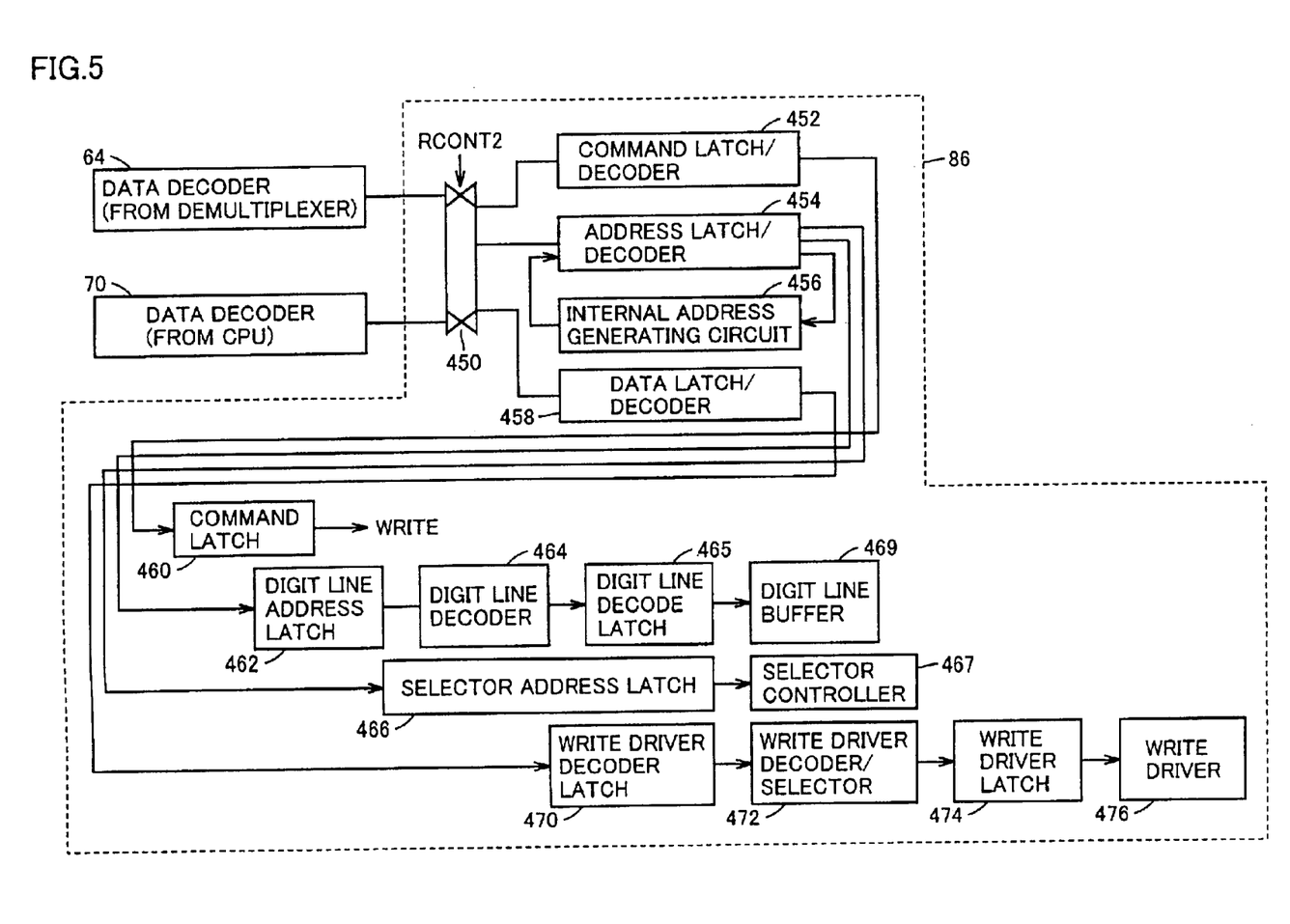
FIG. 5 is a diagram for describing a write controller 86 in the bank.

FIG. 5 is a diagram for describing write controller 86 in a bank.

Referring to FIG. 5, data decoder 64 receives data from an exchange and data decoder 70 receives data transmitted from a signal processor (CPU). A path selector 450 performs a path selection for selecting data of either data decoder 64 or 70 in accordance with a path selection signal RCONT2. Data sequentially transmitted is decoded by a command latch/decoder 452, an address latch/decoder 454, and a data latch/decoder 458. With respect to addresses, the head address is latched by address latch/decoder 454. Serial addresses following the head address are generated by incrementing the head address by an internal address generating circuit 456. The generated address is sequentially used for an array writing operation.

A command detected by command latch/decoder 452 is latched by a command latch 460 until the command is finished. An inputted address is decoded by address latch/decoder 454, recognized as a digit line address and latched by a digit line address latch 462. The address latched by digit line address latch 462 is used for decoding a digit line by a digit line decoder 464. A result of decoding is latched by a digit line decode latch 465. According to an output of digit line decode latch 465, a digit line buffer 469 activates a digit line.

A part of the addresses simultaneously inputted is latched as a selection address for transferring one piece of write data to a desired write driver control, in a selector address latch 466. The latched selection address is used for a selector control in a selector controller 467.

Inputted data is latched by a write driver decoder latch 470 in order to control the direction of a current of a bit line driver. An output of write driver decoder latch 470 is converted to a control signal for determining the direction of a current in a write driver decoder/selector 472. The control signal is latched by a write driver latch 474 and controls a write driver 476.

In the write system, to write data continuously into memory cells at an operation frequency higher than that of the read system, a signal path is divided by a plurality of latches, thereby reducing a data transfer delay between latches. Concretely, a digit line is driven by using address latch 462 for digit line and digit line decode latch 465.

Figure 6:
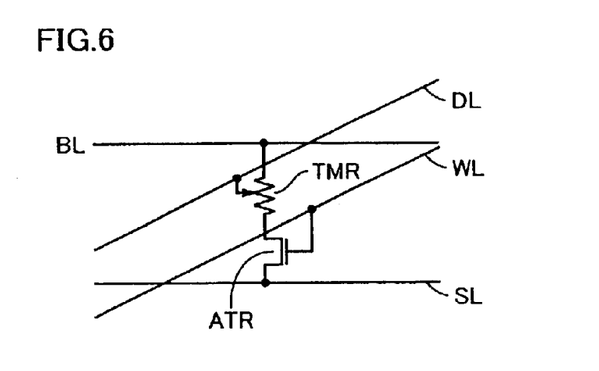
FIG. 6 is a circuit diagram showing the configuration of a memory cell in a semiconductor memory device of the present invention.

FIG. 6 is a circuit diagram showing the configuration of a memory cell in a semiconductor memory device of the present invention.

Referring to FIG. 6, a memory cell includes a tunneling magneto-resistance element TMR of which one end is connected to a bit line BL, and an access transistor ATR provided between the other end of tunneling magneto-resistance element TMR and a source line SL and whose gate is connected to a word line WL. A digit line DL which is activated to select a memory cell at the time of writing data is provided in the vicinity of tunneling magneto-resistance element TMR in parallel with word line WL.

Figure 7:
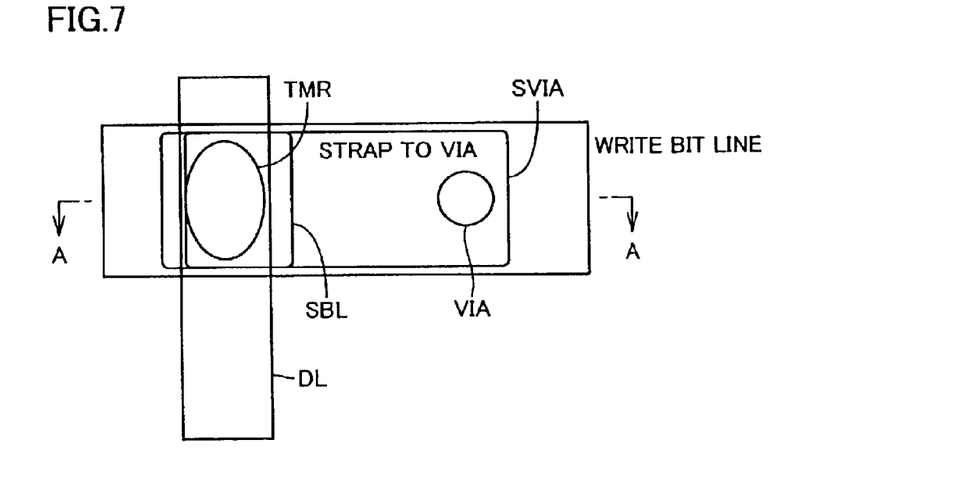
FIG. 7 is a plan view showing the shape of a memory cell.

FIG. 7 is a plan view showing the shape of a memory cell.

Figure 8:
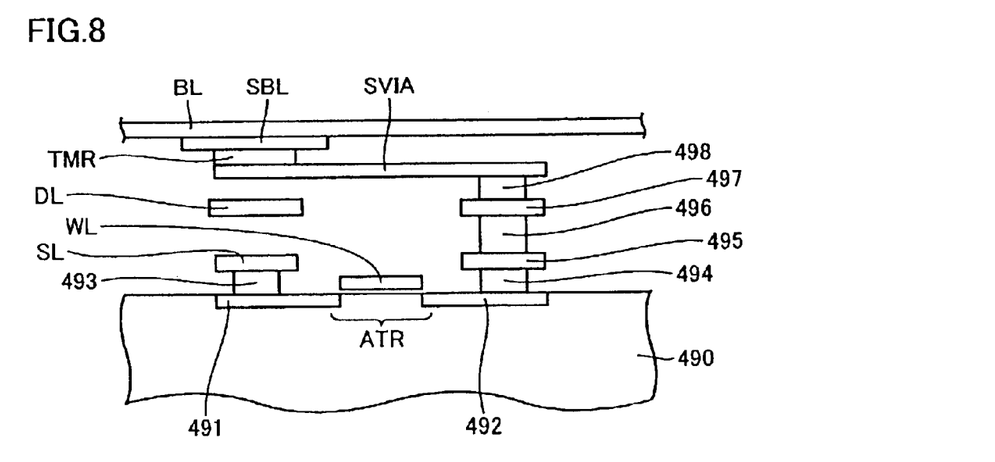
FIG. 8 is a cross-sectional view showing the shape of a memory cell.

FIG. 8 is a cross-sectional view showing the shape of the memory cell.

Referring to FIGS. 7 and 8, n-type impurity regions 491 and 492 are formed in the principal surface of a semiconductor substrate 490, and word line WL is formed in a region between n-type impurity regions 491 and 492. N-type impurity regions 491 and 492 serve as a source and a drain, and word line WL serves as a gate electrode. In such a manner, access transistor ATR is formed.

Over n-type impurity region 491, source line SL is formed by a first metal wiring layer. Source line SL and n-type impurity region 491 are connected to each other via a plug 493 formed in a contact hole.

A conductive layer 495 is formed by the first metal wiring layer over n-type impurity region 492, and conductive layer 495 and n-type impurity region 492 are connected to each other via a plug 494 formed in a contact hole.

By the second metal wiring layer, digit line DL and a conductive layer 497 are formed. Conductive layer 497 is connected to conductive layer 495 via a plug 496 formed in the contact hole. Over digital line DL and conducive layer 497, a conductive layer SVIA as a strap to the contact hole is formed. Conductive layer SVIA is connected to conductive layer 497 via a plug 498 formed in the contact hole. Tunneling magneto-resistance element TMR is formed in a portion over conductive layer SVIA and closest to digit line DL, and a conductive layer SBL as a strap to a bit line is formed so as to sandwich tunneling magneto-resistance element TMR in cooperation with conductive layer SVIA. On conductive layer SBL, bit line BL is formed by a third metal wiring layer.

Tunneling magneto-resistance element TMR includes, although not shown, a ferromagnetic layer having a predetermined fixed magnetic direction and a ferromagnetic layer (free magnetic layer) magnetized in a direction according to a magnetic field applied from the outside.

Figure 9:
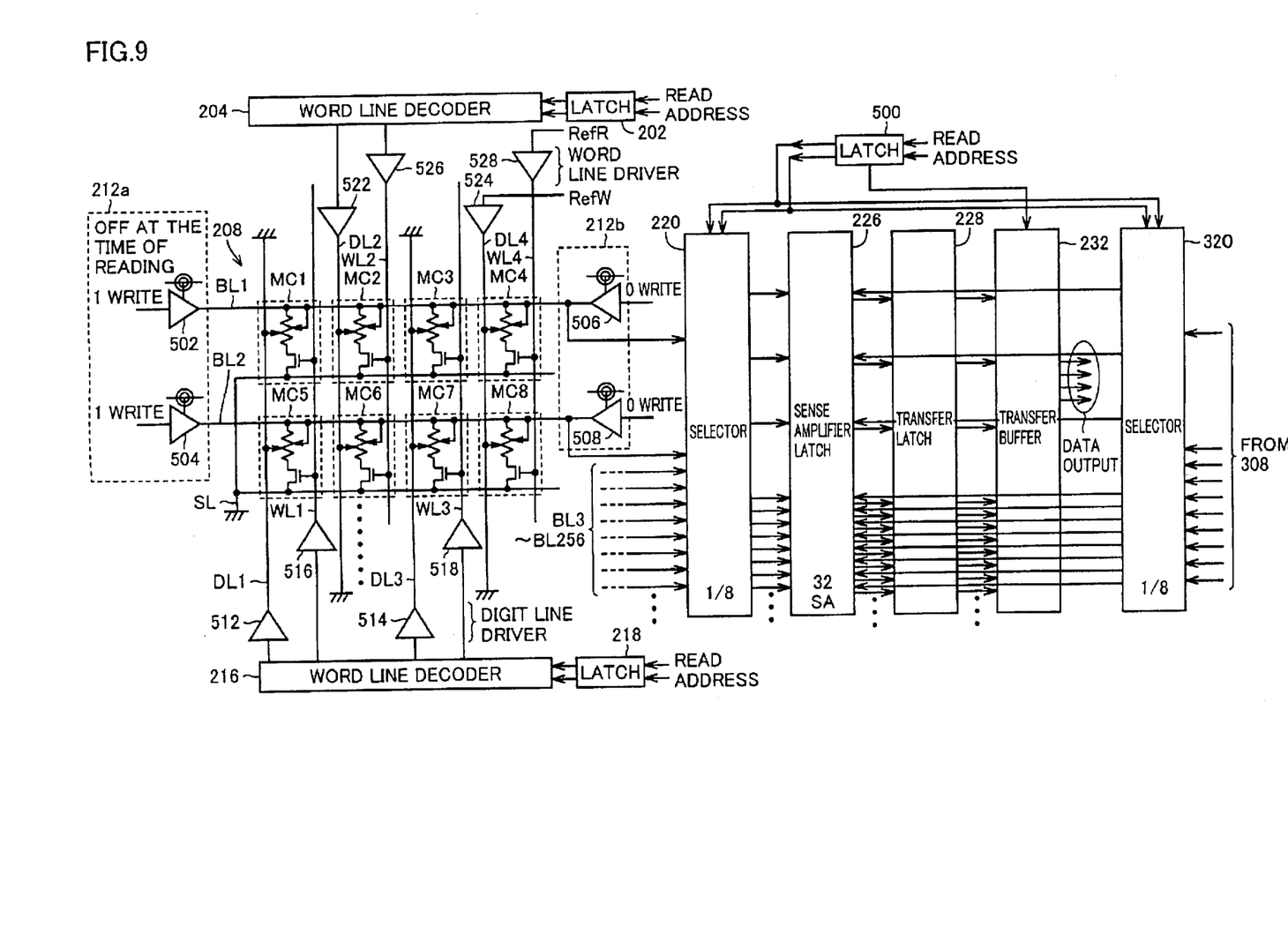
FIG. 9 is a circuit diagram showing a memory array and its peripheral circuits and showing a more detailed configuration of a read system.

FIG. 9 is a circuit diagram showing a more detailed configuration of a memory array and its peripheral circuits regarding the read system.

Referring to FIG. 9, word line decoder 204, word line drivers 526 and 528, and digit line drivers 522 and 524 are disposed on one side of memory array 208. Word line decoder 216, digit line drivers 512 and 514, and word line drivers 516 and 518 are disposed on the other side of memory array 208.

Word lines WL1 to WL4 and digit lines DL1 to DL4 are alternately controlled by word line decoders 216 and 204. By activation of a read flag READ, an address is latched by latches 202 and 218. The latched address is transmitted to word line decoders 204 and 216 to select a word line.

With respect to a reference memory cell, a signal RefR is activated in the memory array as the other memory array of the selected memory array of two memory arrays in each bank, thereby activating word line driver 528 for a reference word line. At this time point, all of 256 memory cells connected to 256 bit lines BL1 to BL256 intersecting the word line are selected.

Memory cells MC1 to MC4 are connected to bit line BL1, and memory cells MC5 to MC8 are connected to bit line BL2. Write drivers 212a and 212b are connected on both sides of bit lines BL1 and BL2. Write driver 212a includes write drivers 502 and 504. Write driver 212b includes write drivers 506 and 508. At the time of reading, the power of each write driver is in the off state. At the time of writing, the power is turned on. Outputs of write drivers 502 and 504 are connected to bit lines BL1 and BL2, respectively. In write drivers 502 and 504, in the case of writing data "1", a current is passed from the power source to a bit line. On the other hand, in the case of writing data "0" to a memory cell, in write drivers 502 and 504, a current is passed from a bit line to ground potential.

On the contrary, in write drivers 506 and 508, in the case of writing data "0" to a memory cell, a current is passed from the power source to a bit line. On the other hand, in the case of writing data "1" to a memory cell, in write drivers 506 and 508, a current is passed from a bit line to the ground potential.

In the case of writing data "0" to a memory cell, in bit line BL1, a current flows from write driver 506 to write driver 502. In the case of writing data "1", a current flows from write driver 502 to write driver 506.

Bit lines BL1 to BL256 and sense amplifier latch 226 are selectively connected to each other by selector 220. Since 32 sense amplifiers are arranged in sense amplifier latch 226, selector 220 selects ⅛ of sense amplifiers. For a control of selector 220, read flag READ latched by latch 500 and a part of an input address are used. When a word line is active, a bit line which is not connected to the sense amplifier is coupled to the potential of source line SL via a memory cell. Any of memory cells MC1 to MC8 of which word line is activated functions as a resistive element. At this time, data held in a memory cell is not destroyed.

Data amplified by the 32 sense amplifiers is latched by sense amplifier latch 226. Data is transferred from sense amplifier latch 226 to transfer latch 228 in a one-to-one corresponding manner. That is, transfer latch 228 includes 32 independent latches for the reason that sense amplifier latch 226 is freed by transferring data to transfer latch 228 so as to be prepared to amplify data from a new memory cell which is read next. Data is read from a new memory cell, for example, when a memory cell connected to a not-selected bit of the same word line is selected by controlling selector 220 or when a different word line is activated to newly access a memory cell. Data of transfer latch 228 is outputted from transfer buffer 232 where ⅛ selection is executed, and data which is actually outputted consists of four bits.

As described above, a feature in the reading operation of the present invention is in that 1/N of the total number of bit lines in the array are selectively connected to the sense amplifiers by a select signal and a number of data is read in parallel. It produces an effect such that, in a read cycle in which access time is long, by reading a number of data pieces in parallel, the data throughput can be maintained.

Figure 10:
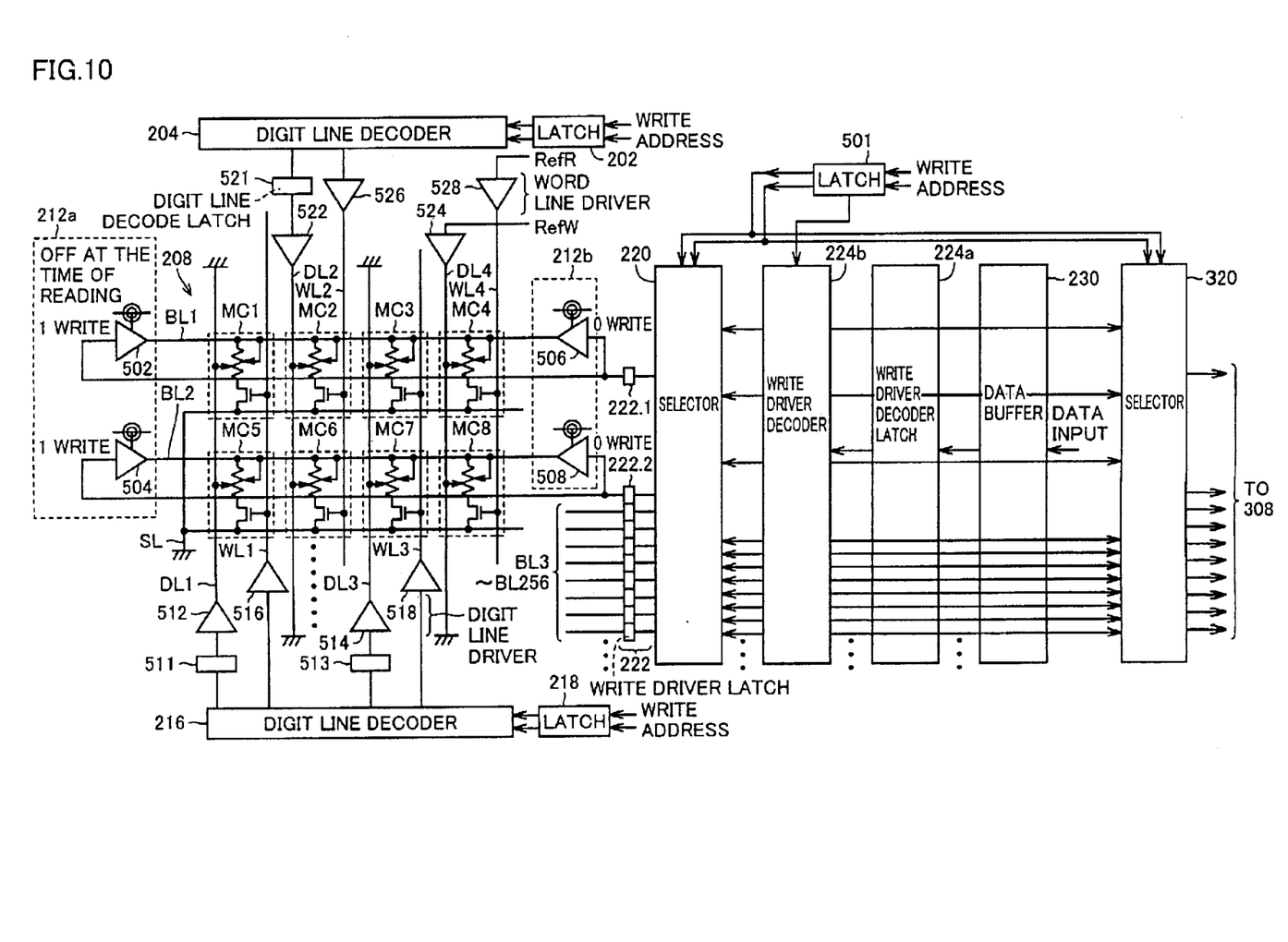
FIG. 10 is a circuit diagram showing the detailed configuration of an array with respect to a write system.

FIG. 10 is a circuit diagram showing the detailed configuration of an array regarding the write system.

Referring to FIG. 10, digit line decoder 204, word line drivers 526 and 528, digit line decode latch 521, and digit line drivers 522 and 524 are disposed on one side of the array. Digit line decoder 216, digit line decode latches 511 and 513, digit line drivers 512 and 514, and word line drivers 516 and 518 are disposed on the other side of memory array 208. Digit line decoders 204 and 216 alternately perform control on digit lines DL1 to DL3 and control on word lines WL1 to WL3.

When a write flag WRITE is made active, an address is latched by latches 202 and 218, and the latched address is transmitted to digit line decoders 204 and 216 for selecting a digit line. The address decoded by the digit line decoders is latched again by digit line decode latches 511, 513 and 521 at the ante stages of the digit line drivers.

Data which is inputted at the time of writing is transferred from data buffer 230 to write driver decoder latch 224a to an independently operating bank bit by bit in one cycle. When write data is transferred to write driver decoder 224b, by a part of the input addresses latched by latch 501 in response to activation of write flag WRITE, the position of a bit line group which is activated in the array is selected.

The bit line group is described to mention that group selection is performed on the basis of a group of eight bit lines. Only one bit line to be finally activated is selected from eight bit lines selected as the bit line group by selector 220, and data is transferred to write driver latch 222 just before the bit line.

Activated write driver latch 222 controls write drivers 212a and 212b to pass a bit line current. Since write drivers 212a and 212b are disposed at both ends of the bit line, information of write driver latch 222 is transmitted to the drivers at both ends.

Concretely, an output of write driver latch 222.1 is supplied to write drivers 502 and 506. Similarly, an output of write driver latch 222.2 is supplied to write drivers 504 and 508.

The reason whey the write cycle can be made shorter than the read cycle with respect to a memory cell will be briefly described.

In a read cycle, after an address is determined, first, a word line is activated. Predetermined time is necessary to activate the word line. After that, data of a memory cell is transferred to a bit line. A cell current of a memory cell is small and is on the order of microamperes. Consequently, it takes some time to drive a sense amplifier via a bit line.

When the current of a memory cell reaches the current of the senses amplifier, a sense operation is started. However, since the cell current is small, it takes some time for sensing in the sense amplifier. Amplified data is latched in the sense amplifier and the latched data is outputted. Total required time is longer than write time.

In contrast, in a writing operation, a combination of addresses is read and a word line is activated. After that, it is sufficient to sequentially pass current to a bit line of a target memory cell in accordance with inputted data. After that, the writing to the memory cell is completed. Consequently, after a word line is activated, data can be written continuously in the minimum cycle. Therefore, the speed of the writing operation can be increased more than that of the reading operation.

In the present invention, the read controller selects a first predetermined number of columns in accordance with an address signal and reads output data from the columns of the first predetermined number in a group. On the other hand, the write controller selects a second predetermined number of columns smaller than the first predetermined number in a cycle shorter than the column selection cycle of the read controller in accordance with the address signal and writes input data to the second predetermined number of columns.

Preferably, the read controller selects the first predetermined number of bit lines in a group from a plurality of bit lines every third predetermined number of bit lines. On the other hand, the write controller selects the second predetermined number of bit lines in a group from the plurality of bit lines every fourth predetermined number of bit lines which is larger than the third predetermined number.

The feature of the write circuits of the present invention is in that latches of a number larger than that in the read circuits are inserted in a transmission path of an address and data, and a multi-stage pipeline process is performed. It produces an effect such that an operation of high frequencies can be performed because of the multi-stage pipeline process.

Figure 11:
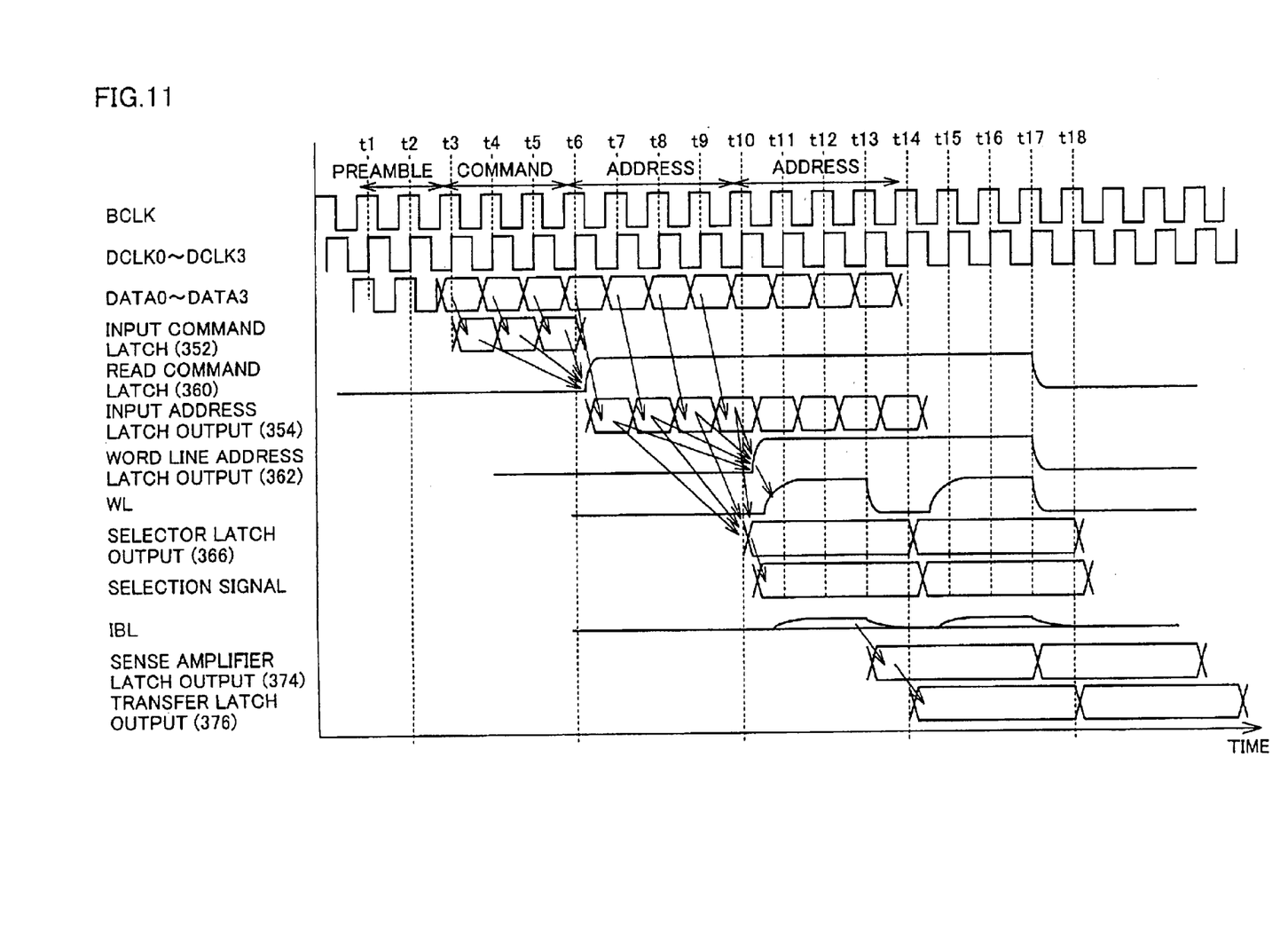
FIG. 11 is an operation waveform chart for describing operations at the time of reading.

FIG. 11 is an operation waveform chart for describing the operations at the time of reading.

With reference to FIGS. 4, 9 and 11, delay clocks DCLK0 to DCLK3 subjected to phase adjustment according to impedances of signal lines via which input data is transmitted, with respect to reference clock BCLK are generated. Synchronously with delay clocks DCLK0 to DCLK3, signals DATA0 to DATA3 are received.

Signals DATA0 to DATA3 are referred to as, for example, channel signals. A channel signal denotes data carried on a single transmission line. As the channel signal, information necessary to operate the memories such as write data, an address, and a command are transmitted in series. To a semiconductor memory device used for the present invention, therefore, any trigger indicating that input data which is serially inputted is valid (for example, a chip enable signal CE in a synchronous DRAM) does not exist.

Instead of the trigger, a predetermined combination of the H and L levels of a channel signal as a preamble is read and used as a trigger signal. For simplicity of the drawing, in FIG. 11, only two clocks are set as a period for the preamble. In practice, a preamble is inputted by using a larger number of clock cycles.

In each of signals DATA0 to DATA3, by inputting a preamble in which two clocks of repetitive waveform of the H and L levels are repeated, data transfer start is detected by an apparatus on the reception side (time t1 to t3).

Following the preamble, a command and an address are successively inputted. As a command, data of three bits is continuously inputted.

On the reception side, after the trigger can be generated internally by the preamble, a command is read. In the period from time t3 to time t6, combinations of H and L of channel signals in three clock cycles are latched by input command latch 352. The latched data is decoded and it is determined that the inputted command is a read command. The decoded command is latched in command latch 360. The result of latch becomes a READ flag (t3 to t6).

After that command, an address is transmitted to the decoding circuit. Since the number of addresses is determined, by sequentially inputting the address, continuous reading operations are performed. Although only four bits are indicated for activation of the word line of one cycle in FIG. 11, in practice, data of the number of necessary bits corresponding to the address is inputted. The inputted address is sequentially received by input address latch 354 and a part of the input address is latched in the word line address latch so as to be used as a word line address. According to the address latched in the word line address latch, a word line is activated.

Simultaneously, a selection signal for selecting a bit line is also made active and data read from a memory cell is transmitted to the bit line. It takes three clocks for the sense amplifier to amplify the data. The read data amplified and latched by the sense amplifier latch is transferred to the transfer latch in the following cycle and held. In the cycle of three clocks, the word line is once made inactive and reset (time t10 to t14).

Data is transferred to the transfer latch in the fourth clock and, after that, the word line is made active again to select a bit line for the next address. As an address for selecting a different bit line and connection of the bit line to a sense amplifier, an address generated by the process of incrementing the head address by internal address generating circuit 356 is used. At time t17, the word line is made inactive, thereby enabling the read command to be finished.

Output data from the transfer latch can be fetched by an external macro at an arbitrary point in an output period from time t14 to time t18. The data can be converted to data of a higher data rate and the resultant data can be transmitted.

As described above, in a reading operation, cycles in which a word line is active is four clock cycles. In the memory cell array, therefore, a pipeline process in the unit of four cycles is performed as an internal operation. The time of the cycles is longer than the write cycle.

Figure 12:
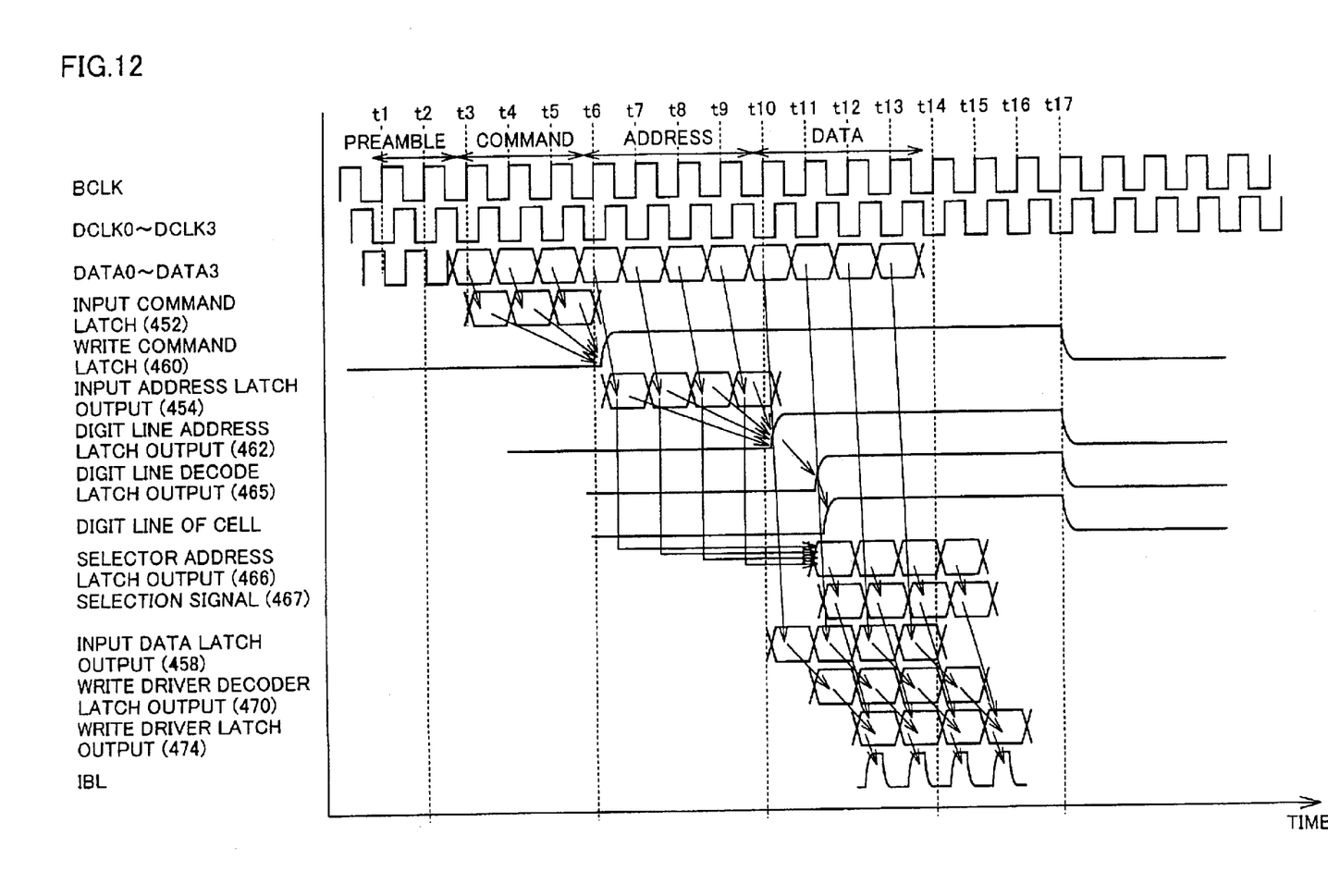
FIG. 12 is an operation waveform chart for describing operations at the time of writing.

FIG. 12 is an operation waveform chart for describing the operation at the time of writing.

Referring to FIGS. 5, 10 and 12, delay clocks DCLK0 to DCLK3 subjected to phase adjustment corresponding to impedances of signal lines via which input data is transmitted with respect to reference clock BCLK are generated. Inputted signals DATA0 to DATA3 are received synchronously with delay clocks DCLK0 to DCLK3, respectively.

First, by providing a predetermined preamble period (from time t1 to t3), start of data transfer is detected. The waveform indicting the preamble period corresponds to two clocks of continuous waves of repetition of H and L levels.

Following the preamble period of start of data transfer, a command and an address are inputted continuously. As the command, data of three bits is continuously inputted in a period from time t2 to time t6. The three bits are latched and decoded by input command latch/decoder 452. As a result of decoding, the data is recognized as a write command and latched in write command latch 460. This becomes write flag WRITE (from time t3 to time t6).

After that, address signals are sequentially inputted. Although only four bits are shown in FIG. 12, in reality, an address signal of a necessary number of bits is inputted. The address is sequentially received by input address latch 454 and a part of the address is used as a digit line address. The digit line address is latched in digit line address latch 462.

According to an address held in digit line address latch 462, a digit line is activated. The activated digit line is latched until a program of a series of data is finished. Simultaneously with the activation of the digit line, a selection signal for selecting a bit line is also activated. Write data is continuously inputted and, together with the selection signal, latched in write driver latch 222 for activation of the write driver. Based on a result of latch in write driver latch 222, the direction of a current of a bit line connected to a memory cell is determined. As a selection address, an address generated by internal address generating circuit 456 by an incrementing process based on an inputted head address is used.

As shown in FIG. 12, in the writing operation, data is sequentially transmitted by a channel signal from the decoder. Consequently, it is difficult to write data of a plurality of bits in a group in parallel into a memory array. In contrast, in the reading operation shown in FIG. 11, data is read in parallel in a group from the memory array. For example, by reading 32 pieces of data simultaneously by 32 sense amplifiers, even the read data is outputted every four bits, an operation of reading data from the next memory array is unnecessary for eight cycles. That is, it is sufficient to operate the memory cell array at a frequency as low as $\frac{1}{8}$ of actual data output frequency.

In contrast, in the writing operation, cycle data is transferred from the outside to the semiconductor memory device bit by bit. Consequently, in the semiconductor memory device used in the present invention, by providing a number of latches of a pipeline in a write access path, a writing operation can be performed even at high frequencies. That is, the memory array operates in cycles of low frequencies (corresponding to eight actual clock cycle) at the time of reading. An operation of writing data every clock is performed at the time of writing.

As described above, in the present invention, an active state of the digit line is continuously maintained in a plurality of clock cycles. During the period, data can be sequentially programmed by activating only a bit line driver, so that higher speed of operation can be realized. Particularly, the present invention is effective to a memory cell to which data can be written at high speed like an MRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, when M is a positive number and N is a positive number smaller than M, comprising:

a memory cell group in which write cycle time is shorter than read cycle time;

a read circuit for repeatedly and continuously reading output data from said memory cell group in a first cycle indicated by a period which is M times as long as one cycle of a clock signal; and a write circuit for repeatedly and continuously writing input data to said memory cell group in a second cycle indicated by a period which is N times as long as one cycle of said clock signal.

2. The semiconductor memory device according to claim 1, wherein said memory cell group includes a plurality of memory cells arranged in a matrix, said write circuit temporarily holds said input data continuously inputted, selects a column in accordance with an address signal, and performs writing operation into the selected column by a pipeline process which is divided into a plurality of stages, and said semiconductor memory device further comprising a row selection circuit for maintaining activation of a predetermined row selection signal indicative of selection of a predetermined row at the time of writing during continuous said writing operation.

3. The semiconductor memory device according to claim 2, wherein said write circuit includes:

a first latch circuit for holding said input data;

a first selection circuit for performing a column selecting operation in a first stage in accordance with said address signal;

a second selection circuit for further selecting a part among a plurality of columns selected by said first selection circuit in accordance with said address signal; and a plurality of second latch circuits provided in correspondence with said plurality of memory cell columns, respectively, said plurality of second latch circuits latching said input data in accordance with selection of said second selection circuit.

4. A semiconductor memory device for continuously reading/writing data synchronously with clock signals, comprising:

a memory cell group in which write time is shorter than read time, said memory cell group including a plurality of memory cells arranged in a matrix;

a read circuit for selecting a first predetermined number of columns in accordance with an address signal and reading output data from said first predetermined number of columns in a group; and a write circuit for selecting a second predetermined number of columns which is smaller in number than said first predetermined number in accordance with said address signal in a cycle shorter than a column selection cycle of said read circuit and writing input data to said second predetermined numbers of columns.

5. The semiconductor memory device according to claim 4, further comprising a plurality of bit lines provided in correspondence with said plurality of memory cell columns, wherein said read circuit selects said first predetermined number of bit lines in a group every third predetermined number of bit lines among said plurality of bit lines, and said write circuit selects said second predetermined number of bit lines in a group every fourth predetermined number of bit lines which is larger than said third predetermined number among said plurality of bit lines.

* * * * *